Feb. 21, 1967 M. N. BROOKS 3,305,824

PEST REPELLING DEVICE

Filed Aug. 9, 1965 2 Sheets-Sheet 1

Miles N. Brooks
Walter H. Nelsen
INVENTORS

BY Clarence A. O'Brien
and Harvey B. Jacobson
Attorneys

Miles N. Brooks
Walter H. Nelsen
INVENTORS

BY Clarence A. O'Brien
and Harvey B. Jacobson
Attorneys

United States Patent Office 3,305,824
Patented Feb. 21, 1967

3,305,824

PEST REPELLING DEVICE

Miles N. Brooks, 938 Robbins Ave., Niles, Ohio 44446, and Walter H. Nelsen, 5515 W. Meadowbrook, Phoenix, Ariz. 58031

Filed Aug. 9, 1965, Ser. No. 478,318
10 Claims. (Cl. 340—15)

This invention relates to apparatus for repelling rodents or the like by generating high frequency audio outputs and more particularly to an electronically controlled device for generating high frequency, audio frequency energy at a plurality of locations.

A primary object of the present invention is to provide an electronic generator of audio frequency energy suitable for repelling rodents or the like.

An additional object of the present invention is to provide an audio frequency generator preferably utilizing solid state circuitry capable of being tailored to a particular installation by changing the number of output transducers driven by the generator.

In accordance with the foregoing object, a further object of the present invention is to provide an audio frequency generator having facilities for synchronizing the outputs of a plurality of audio frequency transducers in a system expanded from a basic arrangement of components.

Figure 1:
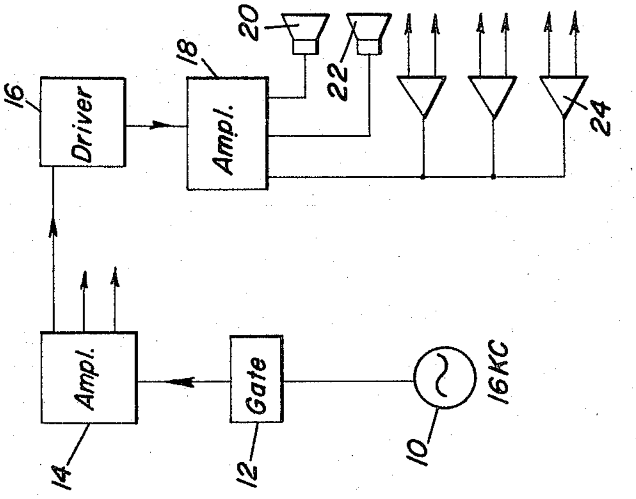

These together with other objects and advantages which will become subsequently apparent reside in the details of construction and operation as more fully hereinafter described and claimed, reference being had to the accompanying drawings forming a part hereof, wherein like numerals refer to like parts throughout, and in which:

FIGURE 1 is a schematic block diagram illustrating the system of the present invention.

Figure 2A:
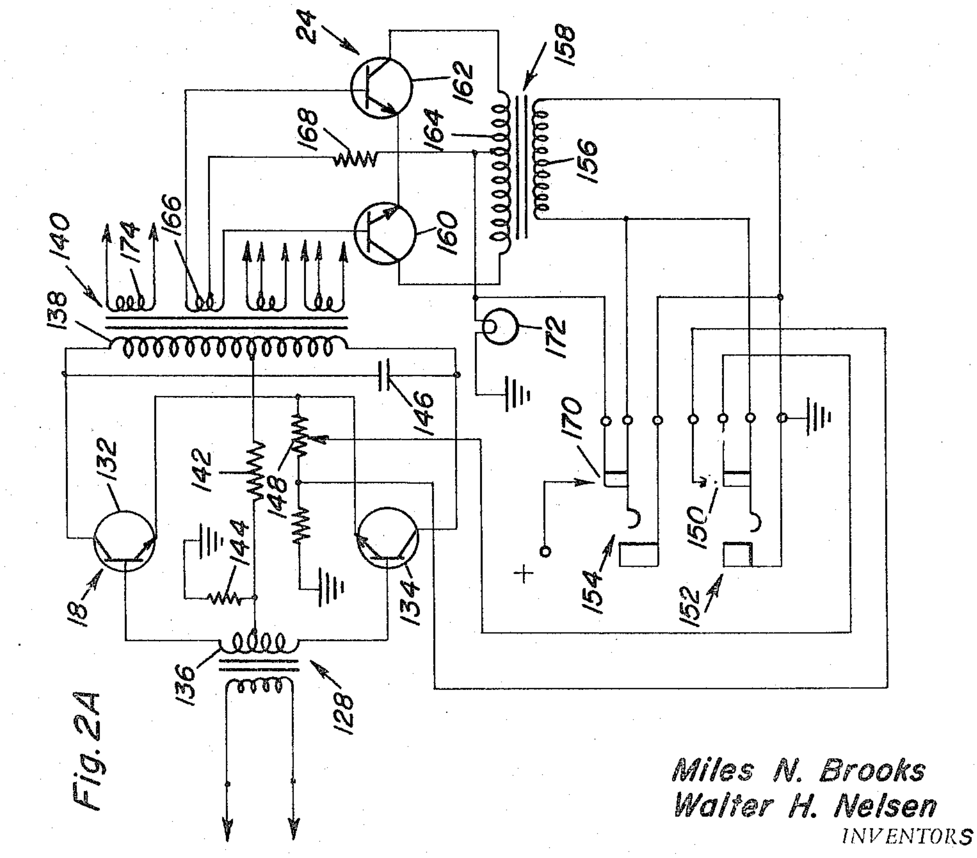
Figure 2:
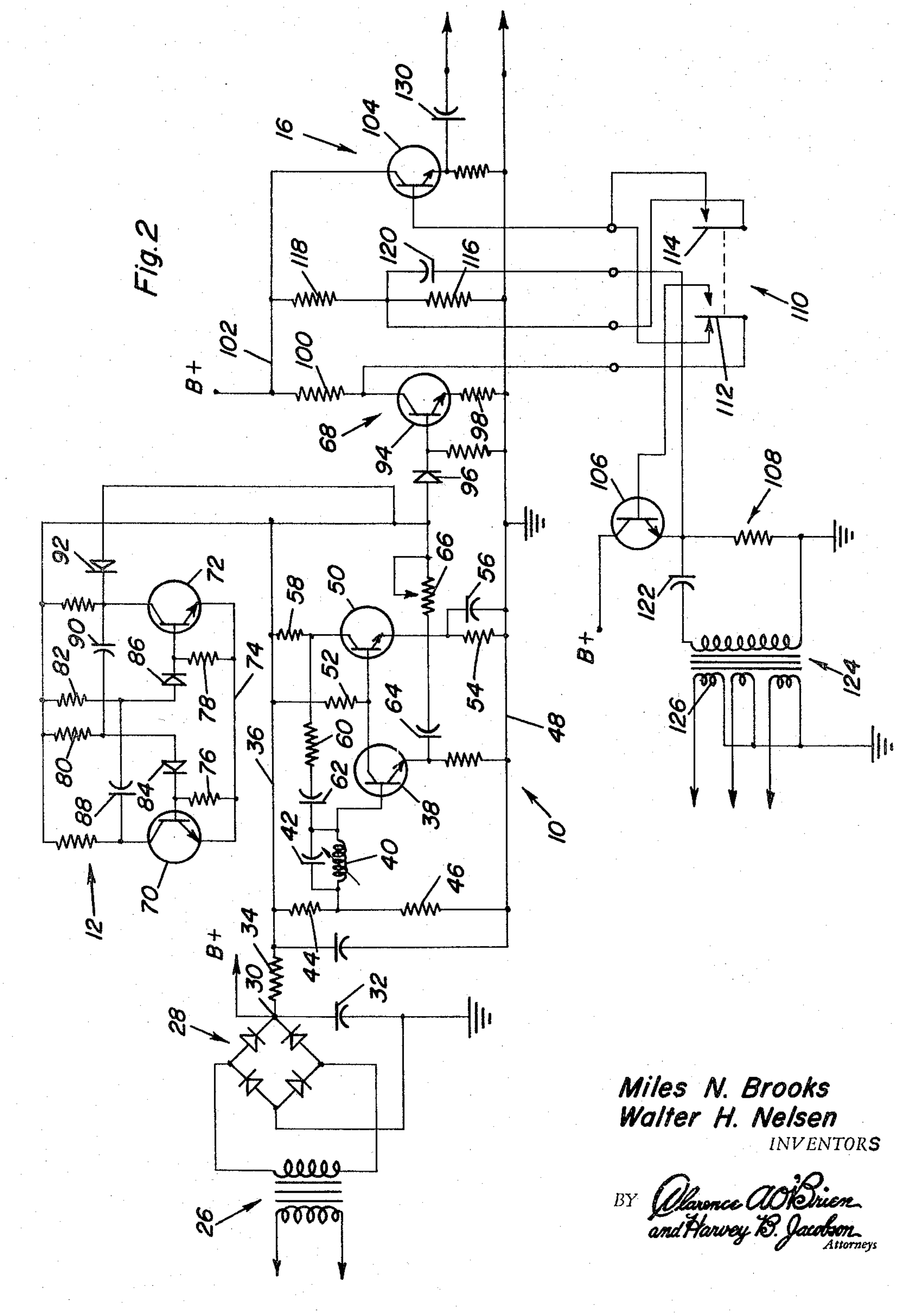

FIGURES 2 and 2*a* are an electrical circuit diagram corresponding to the apparatus of the present invention.

Referring now to the drawings, it will be observed from FIGURE 1 that the apparatus of the present invention utilizes up to a 37 kilocycle oscillator 10 as a source of energy the output of which is gated by the component 12 and fed to an amplifier component 14. The amplifier component 14 includes at least one signal output supplying an amplified signal intermittently interrupted by the gate 12 to a driver component 16 connected to an output amplifier 18 operative to drive two high frequency audio transducers 20 and 22 connected in parallel as well as three additional amplifier stages 24 from which additional transducers are driven. Accordingly, one basic unit associated with the system of the present invention will involve eight synchronized transducers from which high audio frequency energy is emitted for pest repelling purposes. The number of output transducers driven by the system may be increased however by expanding the number of outputs of the amplifier component 14 to as many as ten outputs, each output being fed to another driver component such as the driver component 16 from which eight transducers are driven. The amplifier component 14 when operative to produce a plurality of outputs will therefore be conditioned to synchronize all of the power amplifier stages.

Referring now to FIGURE 2, it will be observed that a D.C. power supply is made available from any available A.C. source by means of the power transformer 26 the secondary of which is connected to a full wave rectifier network 28 having a D.C. output terminal 30 supplying D.C. voltage filtered by the filter capacitor 32 to the various operating components of the system. D.C. voltage is therefore supplied through the coupling resistor 34 to both the oscillator component 10 and the gating component 12 by means of the voltage supply line 36. The D.C. supply voltage from the rectifier 28 is also supplied to the amplifier and driver components as will be hereafter explained.

The oscillator component includes a NPN transistor 38 connected in an emitter follower arrangement. A parallel connected LC network including an adjustable inductor 40 and capacitor 42 are connected between the base of the transistor 38 and the voltage dividing resistors 44 and 46 connected across the voltage supply line 36 and the reference ground line 48. A proper bias voltage is thereby maintained on the base of the transistor 38 the collector of which is connected to the base of a second transistor 50. Proper bias voltage is maintained on the base of transistor 50 by means of the bias resistor 52 connecting the base to the voltage supply line 36. The emitter of the transistor 50 is connected to an RC network above ground including the resistor 54 and capacitor 56 so that a sinusoidal output is obtained from the collector of the transistor 50 maintained at a proper voltage level by the resistor 58 connecting the collector to the voltage supply line 36. A feed-back path is established between the output collector of transistor 50 and the base of transistor 36 through the series connected resistor 60 and capacitor 62 so as to sustain an oscillating output from the emitter of transistor 38 at a frequency determined by the values of the inductor 40 and the capacitor 42. The signal output of the transistor 38 is fed through a coupling capacitor 64 and a voltage level adjusting potentiometer 66 to the amplifier stage 68 associated with the amplifier component 14 aforementioned. The signal supplied to the amplifier stage 68 is however gated by means of the gate component 12.

The gate component 12 consists of a bistable multivibrator including a pair of NPN transistors 70 and 72 alternately switched on and off for gating periods of approximately two seconds. The emitters of the transistors 70 and 72 are interconnected to a common voltage line 74 maintained at a proper level relative to the bases of the transistors by the resistors 76 and 78. Bias voltage from the voltage supply line 36 is supplied to the bases through the resistors 80 and 82 respectively connected in series with the diodes 84 and 86 to the bases. The collectors of the transistors 70 and 72 are interconnected with the base circuits of the transistors by means of the capacitors 88 and 90. The output collector of transistor 72 is also connected by the diode 92 to the input of the amplifier stage 68 so that as the transistor 72 is switched on and off for the aforementioned gating periods, it will supply and remove a forward biasing voltage to the base of the transistor 94 in the amplifier stage 68 through the diode 96. The relative voltages on the emitter and collector of the transistor 94 are maintained by means of the resistors 98 and 100 connected in series with the transistor between the voltage supply line 102 and the ground line 48. The amplified signal output from the collector of the transistor 94 is fed either to the base of driver transistor 104 or to the base of transistor 106 in a mixer amplifier stage 108.

The amplifier component 14 associated with the system of the present invention therefore includes both the amplifier stage 68 and the mixer amplifier stage 108 added to the input amplifier stage 68 in order to synchronize the drive signals supplied to the output amplifiers of an expanded system. Interconnected between the amplifier stages 68 and 108 is a synchronizing switch assembly generally referred to by reference numeral 110. The switch assembly includes a pair of switch sections 112 and 114 which are ganged as shown in FIGURE 2 so that in one position thereof, as shown, the output of the transistor 94 will be directly fed to the base of transistor 104 in the driver component. When the switch assembly 110 is displaced to its other operative position, the switch section 112 disconnects the output of the transistor 96 from the input base of transistor 104 and connects the output of transistor 94 to the input base of the amplifier transistor 106. At the same time, the switch section 114 connects the base of transistor 104 to the voltage dividing network including the resistors 116 and 118 so as to then maintain a proper biasing voltage thereon. The amplified output signal from the transistor 94 will therefore be further amplified by the transistor 106 having an output emitter connected through the signal coupling capacitor 120 to the switch section 114. Accordingly, the same driving signal will be fed to the base of transistor 104 in the driver component 16 as fed through the capacitor 122 to the primary of the output transformer 124 in the mixer amplifier stage 108. A plurality of secondaries 126 in the transformer 124 are thereby operative to feed a plurality of driver components with a driver signal synchronized with that of the driver component 16. The driver component 16 also includes therefore, an output transformer 128 as shown in FIGURE 2*a*, coupled to the emitter of transistor 104 through the signal coupling capacitor 130.

Associated with each driver component, is a basic amplifier stage 18 involving a pair of transistors 132 and 134 having a class B mode of operation. The bases of the transistors 132 and 134 are interconnected to the opposite terminals of the secondary winding 136 of transformer 128. The output collectors of the transistors are interconnected by the primary 138 of the power output transformer 140. The center taps of the secondary winding 136 of transformer 128 and the primary winding 138 of transformer 140 are interconnected by the resistor 142 while the center tap of secondary winding 136 is biased through resistor 144 to a proper voltage level in order to reduce the amount of cross-over distortion from the outputs of the transistors 132 and 134. To further reduce cross-over distortion, the outputs of the transistors are interconnected by the capacitor 146. Further, by adjusting the potentiometer 148, the voltage level of the interconnected emitters of the transistors 132 and 134 above ground may be regulated in order to yield the required output voltage from the transistors necessary to meet the load of the transducers coupled thereto by the transformer 140. It will therefore be observed, that the output of the power amplifier stage 18 will be increased by an amount dependent upon the setting of the potentiometer 148 when transducers load the output amplifiers 24 coupled to the amplifier component 18 by the transformer 140. Toward this end, the potentiometer 148 is rendered effective upon closing of the switch 150 associated with the transducer jacks 152 and 154.

The transducer jacks 152 and 154 are respectively connected in parallel to the secondary winding 156 of output transformer 158 associated with the amplifier stage 24. Each amplifier stage 24 therefore includes a pair of transistors 160 and 162 having interconnected emitters and collectors connected to opposite terminals of the transformer primary 164. The bases of the transistors 160 and 162 are connected to opposite terminals of one of the secondaries 166 associated with the transformer 140, each secondary 166 having a center tap connected by the resistor 168 to a center tap of the primary 164 in the transformer 158. A voltage is applied to the interconnected center taps of the transformers by closing of switch 170 when a transducer connector is plugged into the jack 154 so as to render the amplifier stage 24 operative. At the same time voltage will be supplied to the pilot lamp 172 so as to indicate loading of the amplifier stage 18 by an additional amplifier stage 24. Also, reception of a transducer connector by the jack 152 will render the potentiometer 148 effective as aforementioned in order to yield the proper output voltage from the amplifier stage 18. It will be observed from FIGURE 2*a*, that the output transformer 140 of the amplifier stage 18 includes three secondary winding sections 166 to which similar output amplifiers 24 are connected and a secondary winding section 174 to which a pair of parallel connected transducers 20 and 22 are connected as aforementioned in connection with FIGURE 1.

From the foregoing description, the operation and utility of the device of the present invention will be apparent. It will therefore be appreciated, that requirements for generating high audio frequency energy in various installations may be met in an efficient and reliable manner. It will also be apparent that a basic arrangement of signal synchronized audio transducers may be substantially expanded in number and driver signal synchronization maintained. Also, the circuit associated with the system of the present invention may be readily conditioned to meet the different load requirements depending upon the number of output transducers in operation. Further, the aforementioned objectives of the present invention are accomplished without any excessive cross-over distortion being transmitted from one amplifier stage to the other.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention as claimed.

What is claimed as new is as follows:

1. In combination with a signal generator, a plurality of continuously operative transducers for emitting audio frequency energy and means for distributing signal energy to the transducers from the generator comprising, signal amplifying means connected to the generator for amplifying the signal energy to a regulated level, gating means connected to said amplifying means for intermittently interrupting operation thereof, a plurality of output units respectively connected to different groups of transducers, and switch means operatively connecting said signal amplifying means to the output units for synchronizing the amplified signal energy fed to all of the output units.

2. In combination with a signal generator, a plurality of transducers for emitting audio frequency energy and means for distributing signal energy to the transducers from the generator comprising, signal amplifying means connected to the generator for amplifying the signal energy to a regulated level, a plurality of output units respectively connected to different groups of transducers, and switch means operatively connecting said signal amplifying means to the output units for synchronizing the amplified signal energy fed to all of the output units, wherein said signal amplifying means comprising a first amplifier stage connected to one of the output units, a second amplifier stage connected to the other of the output units, and synchronizing means connected to said switch means for selectively biasing the first amplifier stage.

3. The combination of claim 2 wherein said switch means includes a first switch section alternatively connecting the first amplifier stage to the input of the second amplifier stage or to said one of the output units, means connecting the output of said second amplifier stage to said synchronizing means, and a second switch section connecting said one of the output units to the synchronizing means when the first amplifier stage is connected to the second amplifier stage.

4. The combination of claim 3 wherein each of said output units includes, a driver, a plurality of output amplifiers inductively coupled to said driver, means responsive to loading of at least one of said output amplifiers for changing the output level of the driver, and means for selectively coupling one group of said transducers to the driver and the output amplifiers to load the driver by different amounts.

5. The combination of claim 4 wherein said generator includes, a fixed frequency oscillator, signal coupling means connecting said oscillator to the signal amplifying means, and a bistable multivibrator connected to the signal coupling means for gating the signal energy fed to the signal amplifying means from the oscillator.

6. In combination with a signal generator, a plurality of transducers for emitting audio frequency energy and means for distributing signal energy to the transducers from the generator comprising, signal amplifying means connected to the generator for amplifying the signal energy to a regulated level, a plurality of output units respectively connected to different groups of transducers, and switch means operatively connecting said signal amplifying means to the output units for synchronizing the amplified signal energy fed to all of the output units, each of said output units including, a driver, a plurality of output amplifiers inductively coupled to said driver, means responsive to loading of at least one of said output amplifiers for changing the output level of the driver, and means for selectively coupling one group of said transducers to the driver and the output amplifiers to load the driver by different amounts.

7. In combination with a signal generator, a plurality of transducers for emitting audio frequency energy and means for distributing signal energy to the transducers from the generator comprising, signal amplifying means connected to the generator for amplifying the signal energy to a regulated level, a plurality of output units respectively connected to different groups of transducers, and switch means operatively connecting said signal amplifying means to the output units for synchronizing the amplified signal energy fed to all of the output units, said generator including, a fixed frequency oscillator, signal coupling means connecting said oscillator to the signal amplifying means, and a bistable multivibrator connected to the signal coupling means for gating the signal energy fed to the signal amplifying means from the oscillator.

8. In combination with a signal generator, a plurality of transducers for emitting audio frequency energy and means for distributing signal energy to the transducers from the generator comprising, signal amplifying means connected to the generator for amplifying the signal energy to a regulated level, a plurality of output units respectively connected to different groups of said transducers, and switch means operatively connecting said signal amplifying means to the output units, each of said output units including, a driver, a plurality of output amplifiers inductively coupled to said driver, means responsive to loading of at least one of said output amplifiers for changing the output level of the driver, and means for selectively coupling one group of said transducers to the driver and the output amplifiers to load the driver by different amounts.

9. The combination of claim 8 wherein said generator includes, a fixed frequency oscillator, signal coupling means connecting said oscillator to the signal amplifying means, and a bistable multivibrator connected to the signal coupling means for gating the signal energy fed to the signal amplifying means from the oscillator.

10. A mechanism for repelling pests comprising, an oscillator for generating an audio frequency signal, an amplifier connected to the oscillator for amplifying the signal therefrom, output means connected to the amplifier having a plurality of transducers continuously converting the amplified signal from the amplifier into sound energy, gating means connected to the amplifier for intermittently interrupting supply of said signal to the transducers prior to amplification thereof, and means for synchronizing the amplified signals supplied to the transducers.

References Cited by the Examiner

UNITED STATES PATENTS 3,058,103 10/1962 Evans ---------------- 340—15

BENJAMIN A. BORCHELT, *Primary Examiner.*

P. A. SHANLEY, *Assistant Examiner.*